United States Patent [19]

Morokawa et al.

[11] 4,119,867
[45] Oct. 10, 1978

[54] FREQUENCY DIVISION CIRCUIT

[75] Inventors: Shigeru Morokawa, Higashiyamato; Yukio Hashimoto, Niiza, both of Japan

[73] Assignee: Citizen Watch Co. Ltd., Tokyo, Japan

[21] Appl. No.: 708,188

[22] Filed: Jul. 23, 1976

[30] Foreign Application Priority Data

Jul. 25, 1975 [JP] Japan .................................. 50-90052

[51] Int. Cl.² ...................... H03K 23/02; H03K 17/60
[52] U.S. Cl. .............................. 307/225 C; 58/23 A; 307/224 C; 307/279
[58] Field of Search ........... 307/220 R, 220 C, 224 R, 307/224 C, 225 R, 225 C, 251, 255, 279, 288; 58/23 A, 50 R

[56] References Cited

U.S. PATENT DOCUMENTS

| 3,742,248 | 6/1973 | Eaton, Jr. ........................ 307/225 C |
| 3,749,937 | 7/1973 | Rogers et al. .................... 307/225 C |
| 3,757,510 | 9/1973 | Dill ................................ 307/225 C X |
| 3,833,822 | 9/1974 | Carbrey ............................ 307/225 C |

OTHER PUBLICATIONS

Suzuki et al., "Clocked CMOS Calculator Circuitry", IEEE Journal of Solid-State Circuits, vol. SC-8, No. 6, 12/1973, pp. 462–469.

Primary Examiner—Larry N. Anagnos
Attorney, Agent, or Firm—Sherman & Shalloway

[57] ABSTRACT

An odd number of inverting memory blocks are connected in series in a closed ring circuit. Each inverting elememt comprises a P channel field effect transistor and an N channel field effect transistor which are connected in parallel opposition. Control signals of the same phase are applied to the gate electrodes of the P and N channel field effect transistors. An inverter circuit comprising a pair of field effect transistors having gate electrodes is connected to one of two parallel connected, conductive electrodes of a temporary memory switching circuit. Control gate electrodes of the inverting memory block are controlled by control signals having the same phase and at a frequency to be divided for producing a frequency divided output from the output of one of the inverting memory blocks.

5 Claims, 5 Drawing Figures

FREQUENCY DIVISION CIRCUIT

BACKGROUND OF THE INVENTION

(1) Field of the Invention

This invention relates to a frequency division circuit and more particularly to a frequency division circuit suitable for use in an electronic timepiece utilizing field effect transistors.

(2) Technical Considerations and Prior Art

A frequency division circuit generally comprises an odd number of clock controllable delay circuits having a negative amplification coefficient and being connected in a closed ring circuit. For example, the frequency division circuit may include flip-flop circuits each including a data input from a latch circuit and an inverted output. This circuit requires two phase clock pulses for the purpose of writing an information signal ("0" or "1") into a flip-flop circuit in an earlier stage or into a flip-flop circuit in a later stage and to accurately store the written information. Furthermore, the flip-flop circuit in respective stages consumes substantial power in storing, inverting and amplifying the information from the preceding stage and for transmitting the amplified information to the succeeding stage. Further, in an electronic timepiece of high accuracy, where, for example, it is necessary to reduce a reference frequency of several MHz to less than 1 Hz, it is necessary to use a frequency division circuit having a high ratio of frequency division. In order to cause a plurality of flip-flop circuits to oscillate when connected in a ring, it is generally necessary to serially connect $(2n + 1)$ flip-flop circuits or $2n$ flip-flop circuits and one inverting circuit, where $n$ is an integer. When $n$ is larger than 5, oscillations of various modes appear in the serially connected circuit, so that it becomes necessary to use a detection circuit or a mode locking circuit for the purpose of deriving only a specific oscillation mode as the ratio of frequency division increases.

For this reason, where a prior art frequency division circuit is applied to an electronic timepiece it is impossible to simplify the circuit in order to decrease the power consumption and minaturize the timepiece, both of which are highly desirable considerations in the design of electronic timepieces. Furthermore, the circuit for generating two phase clock pulses also consumes a great deal of power.

SUMMARY OF THE INVENTION

Accordingly, it is an object of this invention to provide an improved frequency division circuit including a temporary storing block capable of inverting and amplifying an information signal and which can store an information signal from a preceding stage in respective flip-flop circuits with extremely small power consumption.

Another object of this invention is to provide an improved frequency division circuit operable at high frequencies without the necessity of using any mode locking device or by using a relatively simple mode locking device.

The invention is based on the unique utilization of the fact that the flip-flop circuit of a frequency division circuit operating at a high frequency is not required to store information signals over a long period of time. According to this invention, inverting memory switching elements of an odd number are serially connected in a closed ring circuit. Each switching element has a switching and memory function utilizing the stray capacitance of a field effect transistor. For example, a MOS-FET, may be used as a memory element and an inverter circuit constituted by field effect transistors.

Thus, according to this invention, there is provided a frequency division circuit comprising inverting memory blocks of an odd number, each including a temporary memory switching element having a P channel field effect transistor and a N channel field effect transistor which are connected in parallel opposition, wherein the P and N channel field effect transistors have threshold voltages of $VTP_2$ and $VTN_2$ respectively. Control signals of the same signal are applied to the gate electrodes of the P and N channel field effect transistors. Each memory block also includes an inverter circuit constituted by a pair of field effect transistors with their gate electrodes connected to one of two parallelly connected conductive electrodes of the temporary memory switching element. The inverting memory blocks are connected serially in a closed ring with the output of the inverter of a preceding block connected to the conductive electrode of the succeeding temporary memory switching element, which is located on the side opposite to the conductive electrode connected to the gate electrodes of the field effect transistors of the inverter. This arrangement controls the control gate electrodes of the inverting memory block by control signals having the same phase and at a frequency to be divided for producing a frequency-divided output from the output of one of the inverting memory blocks.

It is preferable to constitute the inverter with complementarily combined P and N channel field effect transistors having threshold voltages of $VTP_1$ and $VTN_1$ respectively and to establish the following relationships between these threshold voltages and the threshold voltages of the P and N channel transistors of the temporary memory switching element:

$$|VTP_2| > VTN_1 \text{ and}$$

$$VTN_2 > |VTP_1|$$

Furthermore, the threshold voltages $VTP_1$ and $VTN_1$ and the source voltage VB are selected to satisfy a relationship $$|VTP_1| + VTN_1 \geqq VB$$

DESCRIPTION OF THE PREFERRED EMBODIMENTS

The invention will now be described with reference to the accompanying drawings. As has been pointed out hereinabove, a frequency division circuit utilized in an electronic timepiece is required to reduce the frequency from several MHz to less than 1 MHz at an extremely high ratio of frequency division. Denoting the ratio of frequency division by N, in order to realize a frequency division circuit having a ratio of 1/N, usually a mode locking device is necessary, which is not suitable for an electronic timepiece, wherein it is necessary to miniaturize as far as possible the chip size of an integrated circuit. Accordingly, in order to make a 1/N frequency division circuit (where N is an odd number larger than 11) without using any mode locking device, it is necessary to connect in series a plurality of ⅓, 1/5 or 1/7 frequency division circuits not using a mode locking device.

Figure 1:
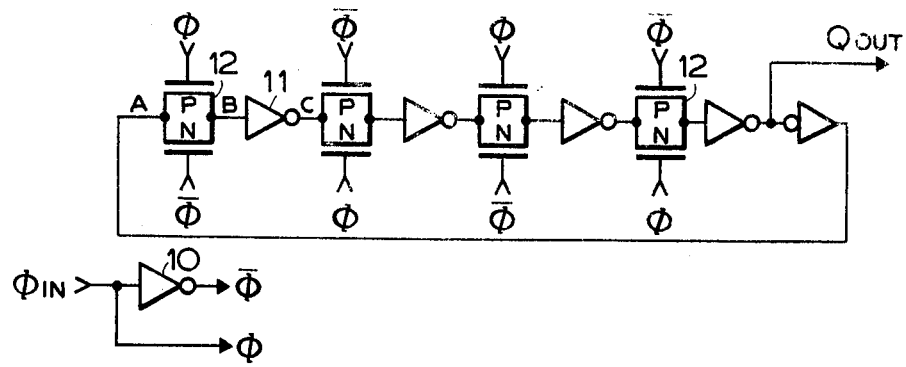
FIG. 1 is a connection diagram showing one example of a prior art dynamic frequency division circuit.

FIG. 1 shows one example of a prior art dynamic frequency division circuit, wherein four dynamic latch circuits 12 are connected in a closed ring and one of the latch circuit is constructed to also act as an inversion circuit, thus forming a ¼ frequency division circuit. This circuit utilizes a transmission gate devised by Radio Corporation of Amercia. Accordingly, it can be considered that one of two data type, dynamic, master-slave type flip-flop circuits is constructed to act also as an inversion circuit. In this example, the clock signal comprises 2 phase signals, namely a frequency division input signal $\phi$ and a singal $\bar{\phi}$ inverted by an inverter 10 which signals are necessary to drive the transmission gate. Assuming now that the signal $\phi$ to be frequency divided has a frequency of 4 MHz, in this example it is necessary to drive inverter 10 at 4MHz to form an inverted clock signal $\bar{\phi}$. The circuit shown in FIG. 1 can be converted into a ⅓ frequency division circuit by detecting four states determined by the conditions of four latch circuits for providing a mode locking.

It is an object of this invention to decrease the power consumption, to improve the circuit such that it can operate by a single phase clock signal, without using two phase clock signals as in the prior art circuit shown in FIG. 1 and to decrease the power consumption of the inverter. When the frequency division circuit of this invention is incorporated into a quartz oscillator, it is possible to incorporate the capacitive load comprising the major proportion of the input impedance of the frequency divider of this invention into the oscillation capacitance of the oscillation circuit, thus greatly decreasing power consumption due to high frequency charging and discharging of stray capacitance.

Figure 2:
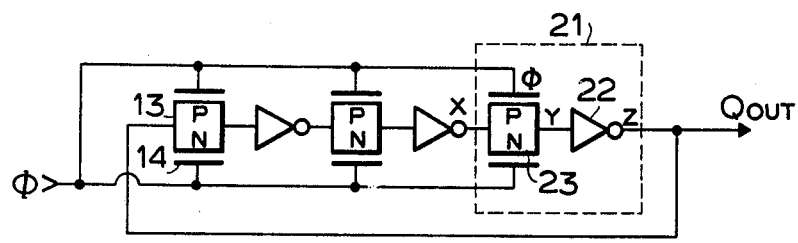
FIG. 2 is a connection diagram of one embodiment of the novel frequency division circuit embodying the invention.

In a preferred embodiment of this invention shown in FIG. 2, instead of utilizing a transmission gate 12 as in FIG. 1, a pair of PN complementary type field effect transistors 13 and 14 are connected in parallel and a single clock signal is applied in common to the gate electrodes of the transistors. The outputs of the pair of PN complementary field effect transistors 13 and 14, or rather the parallel connected electrodes thereof, are connected to the gate input of an inverter 22 comprising field effect transistor, which is a temporary memory switching block the output of which is connected to an invertor 22. The block may be considered as an inverting memory block. The temporary memory switching element 23 functions to write and store a logic value of a data signal X into the block according to a control signal $\phi$, and to send out the stored logic value, or the logic value of data X, as an inverted output signal Z, under a prescribed rule related to the logic value of $\phi$.

Figure 3:
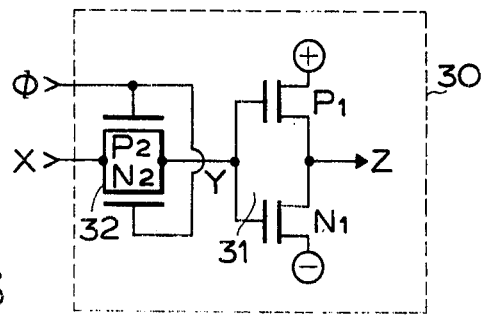
FIG. 3 shows one example of an inversion memory block element utilized in this invention.

FIG. 3 shows an example in which an inverting memory block 30, similar to block 21 shown in FIG. 2, comprises complementary type field effect transistors. The relationship among X, Y, Z and $\phi$, shown in FIG. 3 and the conditions that establish the relationship are as follows. The threshold voltages of two field effect transistors $P_2$ and $N_2$ of the switching memory element 32, and those of two field effect transistors $P_1$ and of $N_1$ of inverter 31 differ as follows:

$$|VTP_2| > VTN_1$$

$$VTN_2 > |VTP_1|$$

Further, in order to decrease current, the relationship between source voltage VB and the threshold voltages of the field effect transistors constituting the inverter should satisfy the following equation:

$$VTN_1 + |VTP_1| \geqq VB,$$

where $VTP_2$, $VTN_1$, $VTN_2$ and $VTP_1$ represent the threshold voltages of field effect transistors $P_2$, $N_1$, $N_2$ and $P_1$, respectively. When this condition is satisfied, the relationship shown in FIG. 1 is established. In Table 1, Y represents the previous state of Y, "1" represents the high logic level H that is the potential of VDD and "0" the low logic level L, that is the potential of VSS.

Table 1

| $\phi$ | X | y | Y | Z |
|---|---|---|---|---|
| 0 | 0 | 0 | 0 | 1 |
| 0 | 0 | 1 | $|VTP_2|$ | 0 |
| 0 | 1 | 0 | 1 | 0 |
| 0 | 1 | 1 | 1 | 0 |
| 1 | 0 | 0 | 0 | 1 |
| 1 | 0 | 1 | 0 | 1 |
| 1 | 1 | 0 | 1-$VTN_2$ | 1 |
| 1 | 1 | 1 | 1 | 0 |

The following equation (1) can be obtained by varying the expressions of Table 1 according to conditions.

$$\bar{Z} = (\bar{\phi}\cdot\bar{X} + \phi\cdot X)\cdot y + \bar{\phi}X \qquad (1)$$

This equation shows that when $\phi X + \bar{\phi}\bar{X} = 1$, Z maintains its previous state and that when $\phi X + \bar{\phi}\bar{X} = 0$ the data of X is written directly and inverted. Comparing this block with a conventional transmission gate, a relation expressed by the following equation (2) exists between the gate input signal $\phi$ of the P channel field effect transistor 12 shown in FIG. 1, input data A, inverter input B and inverter output C:

$$\bar{Z} = \phi\cdot b + \bar{\phi}A \qquad (2)$$

where $b$ is the previous state of input B.

As can be clearly noted, equation (2) is simpler than equation (1). In other words, the circuit system utilizing a transmitting gate as shown in FIG. 1 is a simple system because whether the data are to be written or stored is determined solely depending upon the value of $\phi$.

Although the system expressed by equation (1) is not simple in terms of a mathematical expression it has the following advantages:

(a) It can operate with a single phase block.

(b) Whether the data should be stored or written is determined by the inverted output of the block and the clock signal of the succeeding stage so that there is no fear of continuously bypassing the data around a plurality of blocks with the result that the data is accurately inverted and transferred through successive blocks, which are connected in cascade in accordance with the variation of the logic value of a one phase clock pulse.

When an odd number of blocks, that is, $(2m + 1)$ blocks, where $m$ is an integer, are connected in a ring and applied with a clock pulse, the blocks can be considered as one inverter having a delay time equal to $(2m + 1)$ times one half period of the clock signal whereby the circuit can oscillate at a frequency whose one half period is equal to $(2m + 1)$ times of one half period of the clock signal due to a high loop gain caused by serially connected $(2m + 1)$ inverters. In other words, the frequency is divided by $(2m + 1)$. The condition that determines the oscillation frequency permits a mode wherein $(2m + 1)$ times one half period of the clock signal is equal to $l$ times of the half period of the oscillation period, so that where the number of blocks connected in the ring is an odd number larger than 9 it is necessary to add a mode locking circuit.

Figure 4:
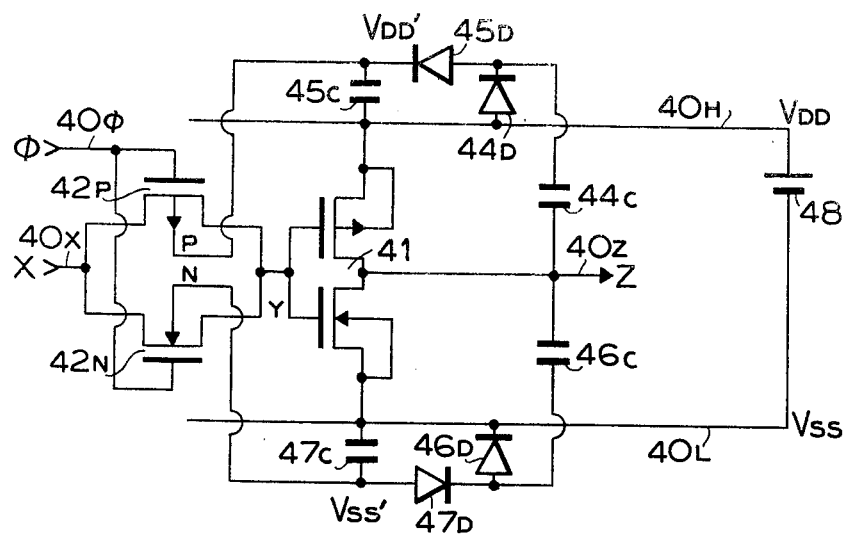
FIG. 4 is a connection diagram showing one example of a back gate control circuit showing one application of this invention.

FIG. 4 shows one example of a method for changing the threshold values of the transistors and the threshold values of the transistors of the switching memory section, wherein the threshold values are varied by applying a back gate bias voltage to the switching transistors through diodes 44D, 45D 46D, 47D and capacitors 44C, 45C, 46C and 47C.

Reference numeral 40H depicts a high level line connected to the positive electrode of a battery cell as a DC power supply source 48, and 40L depicts a low level line connected to the negative electrode thereof. Numeral 41 illustrates an inverter, 42P a P channel field effect transistor and 42N a N channel field effect transistor. These transistors perform a switching function.

The lowest level of output 40Z from the inverter 41 is clamped at the level VDD of the high level line 40H of the power supply source 48 by means of a capacitor 44C and diode 44D, and is then rectified by a diode 45D so as to be charged in a capacitor 45C as $V_{DD'}$. Then the stored charge $V_{DD'}$ is of a higher potential than $V_{DD}$ so as to be applied as a back gate bias voltage to the switching field effect transistor 42P, thereby adjusting the threshold voltage of the gate of the transistor 42P. The capacitors 46C, 47C and diodes 46D, 47D also form a biasing circuit to synthesize a back gate bias potential level like the capacitors 44C, 45C and diodes 44D, 45D. This biasing circuit synthesizes a potential lower than that of the low level line 40L of the power supply source 48.

In the circuit shown in FIG. 4, input data 40X is controlled by clock signals 40 $\phi$ so that the output signals 40Z may be obtained and the back gate biasing is effected when an output signal varying with time appears on the line 40Z.

Variation of the threshold values can also be accomplished by means of ion implantation or by the control of the thickness of the gate insulator film. Furthermore, it is also possible to equivalently satisfy the threshold value condition by adjusting the logical amplitude of the gate, or the DC level of the switching memory section, as shown in FIG. 5.

Figure 5:
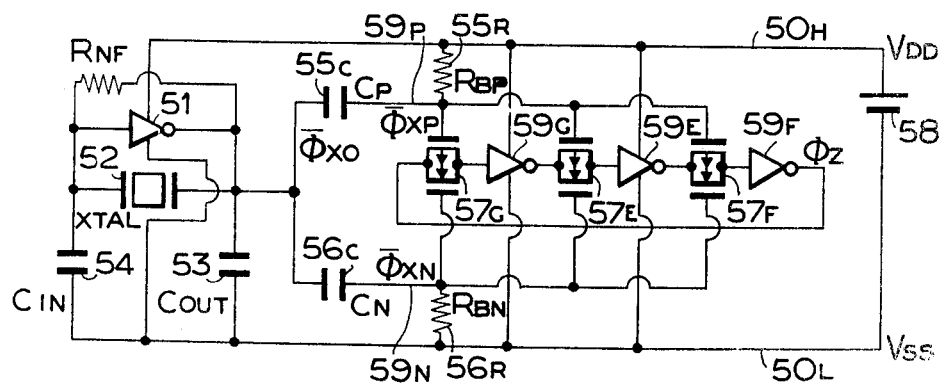
FIG. 5 is a connection diagram showing a modified embodiment of this invention.

FIG. 5 shows another embodiment of this invention wherein the clock pulses applied to the switching circuits 57G, 57E, 57F and the signals applied to the signal lines 59P, 59N can be set such that they are different in DC voltage level and are alternatively in phase with each other. Oscillating outputs $\bar{\phi} \times 0$ can be obtained from a crystal oscillating circuit comprising an inverter 51 biased to the active area and having a high amplifying ratio with the negative sign, a crystal oscillator element 52, an input capacitor 54 and an output capacitor 53. The oscillating outputs $\bar{\phi} \times 0$ are alternatively coupled, each being coupled directly with a high level line 50H and a low level line 50L by means of resistors 55R and 56R.

In this embodiment, the DC potential difference is equal to the output voltage of the battery cell 58. Here the stray capacity in the coupling capacitors 55C and 56C is considered as the capacitance of the capacitor 53C.

The switching circuits 57G, 57E, 57F are connected in a ring with the inverters 59G, 59E, 59F sandwiched therebetween and operate as ½ frequency dividers. Therefore ½ frequency of $\bar{\phi} \times 0$ is equal to the frequency of $\phi Z$. The DC potentials of the two control signal lines 59P, 59N may be applied while dividing the output voltage of the battery cell 58 through resistors.

What is claimed is:

1. A frequency division circuit comprising inverting memory blocks of an odd number each including: (1) a temporary memory switching element having a P channel field effect transistor and an N channel field effect transistor each of which are connected in parallel opposition, said P and N channel field effect transistors having threshold voltages of $VTP_2$ and $VTN_2$, respectively; means for applying control signals of the same phase to the gate electrodes of said P and N channel field effect transistors, said memory blocks also including: (2) an inverter circuit including a pair of field effect transistors having gate electrodes connected to one of two connected conductive electrodes of said temporary memory switching element which are formed by the parallel connection of the complementary field effect transistors; and means for serially connecting said inverting memory blocks in a closed ring with the output of the inverter of a preceding block connected to the conductive electrode of the succeeding temporary memory switching element, which is located on the side opposite to the conductive electrode connected to the gate electrodes of said field effect transistors of said inverter, thereby controlling the control gate electrodes of said inverting memory block by control signals having the same phase and at a frequency to be divided for producing a frequency divided output from the output of one of said inverting memory blocks.

2. The frequency division circuit according to claim 1 wherein said inverter comprises a complementary inverter constituted by complementarily combining a P channel field effect transistor and a N channel field effect transistor respectively having threshold voltages of $VTP_1$ and $VTN_1$, which have the following relationship with reference to said threshold voltages $VTP_2$ and $VTN_2$ of the P and N channel field effect transistors of said temporary memory switching element;

$|VTP_2| > VTN_1$ $VTN_2 > |VTP_1|$

3. The frequency division circuit according to claim 2 wherein said threshold voltages satisfy the following relation:

$$|VTP_1| + VTN_1 \geq VB$$

where $VB$ represents a source voltage.

4. The frequency division circuit according to claim 2 wherein at least one of the conditions of $VTP_2 \neq VTP_1$ and $VTN_2 \neq VTN_1$ is realized by the back gate control of said field effect transistors.

5. The frequency division circuit according to claim 1 wherein the signal applied to the gate of the P channel field effect transistor and the signal applied to the gate of the N channel field effect transistor have different DC levels.

* * * * *